United States Patent
Bachman et al.

(10) Patent No.: US 7,952,206 B2
(45) Date of Patent: May 31, 2011

(54) SOLDER BUMP STRUCTURE FOR FLIP CHIP SEMICONDUCTOR DEVICES AND METHOD OF MANUFACTURE THEREFORE

(75) Inventors: Mark A. Bachman, Sinking Spring, PA (US); Donald S. Bitting, Sinking Spring, PA (US); Sailesh Chittipeddi, Allentown, PA (US); Seung H. Kang, Sinking Spring, PA (US); Sailesh M. Merchant, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 363 days.

(21) Appl. No.: 11/459,249

(22) Filed: Jul. 21, 2006

(65) Prior Publication Data

US 2007/0069394 A1 Mar. 29, 2007

Related U.S. Application Data

(60) Provisional application No. 60/720,818, filed on Sep. 27, 2005.

(51) Int. Cl.
*H01L 23/48* (2006.01)
*H01L 23/52* (2006.01)
*H01L 29/40* (2006.01)

(52) U.S. Cl. . 257/778; 257/737; 257/738; 257/E21.508; 257/E23.021

(58) Field of Classification Search .............. 257/737, 257/738, 778, 772, 779–782, 786, E23.015, 257/E23.02, E23.023
See application file for complete search history.

(56) References Cited

U.S. PATENT DOCUMENTS

| | | | |
|---|---|---|---|
| 5,106,461 A | 4/1992 | Volfson et al. | |
| 5,128,737 A | 7/1992 | van der Have | |
| 5,248,903 A | 9/1993 | Heim | |
| 5,656,858 A * | 8/1997 | Kondo et al. | 257/737 |
| 5,659,201 A | 8/1997 | Wollesen | |
| 5,751,065 A | 5/1998 | Chittipeddi et al. | |
| 5,854,514 A * | 12/1998 | Roldan et al. | 257/746 |
| 6,037,664 A | 3/2000 | Zhao | |
| 6,187,680 B1 | 2/2001 | Costrini et al. | |
| 6,306,750 B1 | 10/2001 | Huang et al. | |
| 6,350,705 B1 | 2/2002 | Lin | |
| 6,426,556 B1 * | 7/2002 | Lin | 257/738 |
| 6,440,833 B1 | 8/2002 | Lee et al. | |
| 6,563,216 B1 | 5/2003 | Kimura et al. | |
| 6,614,091 B1 | 9/2003 | Downey et al. | |
| 6,620,720 B1 | 9/2003 | Moyer | |
| 6,642,597 B1 | 11/2003 | Burke et al. | |
| 6,649,961 B2 * | 11/2003 | Estacio et al. | 257/296 |
| 6,689,680 B2 | 2/2004 | Greer | |
| 6,717,270 B1 | 4/2004 | Downey et al. | |
| 6,743,979 B1 | 6/2004 | Berman et al. | |
| 6,798,035 B1 | 9/2004 | Low | |
| 6,825,563 B1 | 11/2004 | Ranganathan et al. | |

(Continued)

FOREIGN PATENT DOCUMENTS

CN 1953166 A 4/2007

(Continued)

*Primary Examiner* — A. Sefer
*Assistant Examiner* — Dilinh P Nguyen

(57) ABSTRACT

The invention provides, in one aspect, a semiconductor device that comprises an interconnect layer located over a semiconductor substrate. A passivation layer is located over the interconnect layer and having a solder bump support opening formed therein. Support pillars that comprise a conductive material are located within the solder bump support opening.

10 Claims, 13 Drawing Sheets

U.S. PATENT DOCUMENTS

| | | |
|---|---|---|
| 6,841,872 B1 * | 1/2005 | Ha et al. .................. 257/736 |
| 6,864,578 B2 | 3/2005 | Angell et al. |
| 7,049,170 B2 * | 5/2006 | Savastiouk et al. ........... 438/106 |
| 7,160,805 B1 | 1/2007 | Burke et al. |
| 7,242,099 B2 * | 7/2007 | Lin et al. ................ 257/778 |
| 7,301,231 B2 | 11/2007 | Anatol et al. |
| 7,364,998 B2 * | 4/2008 | Chiu et al. ................ 438/597 |
| 2001/0051426 A1 | 12/2001 | Pozder et al. |
| 2003/0127502 A1 * | 7/2003 | Alvarez .................. 228/246 |
| 2003/0222348 A1 | 12/2003 | Okada |
| 2004/0134974 A1 | 7/2004 | Oh et al. |
| 2004/0201101 A1 | 10/2004 | Kang et al. |
| 2006/0006552 A1 | 1/2006 | Kang et al. |
| 2006/0091536 A1 * | 5/2006 | Huang et al. ................ 257/734 |
| 2007/0063352 A1 | 3/2007 | Archer, III et al. |

FOREIGN PATENT DOCUMENTS

| | | |
|---|---|---|
| WO | 03079434 A2 | 9/2003 |

* cited by examiner

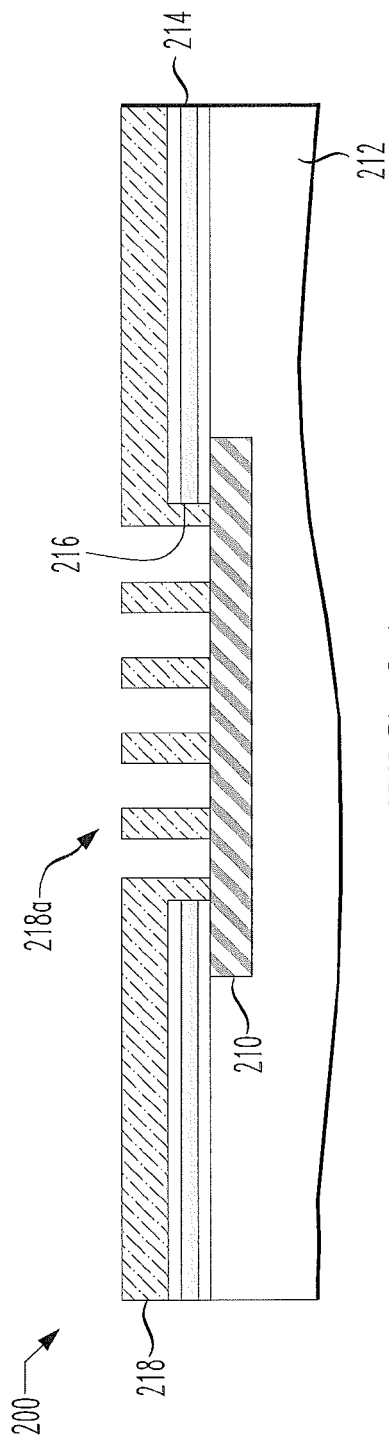
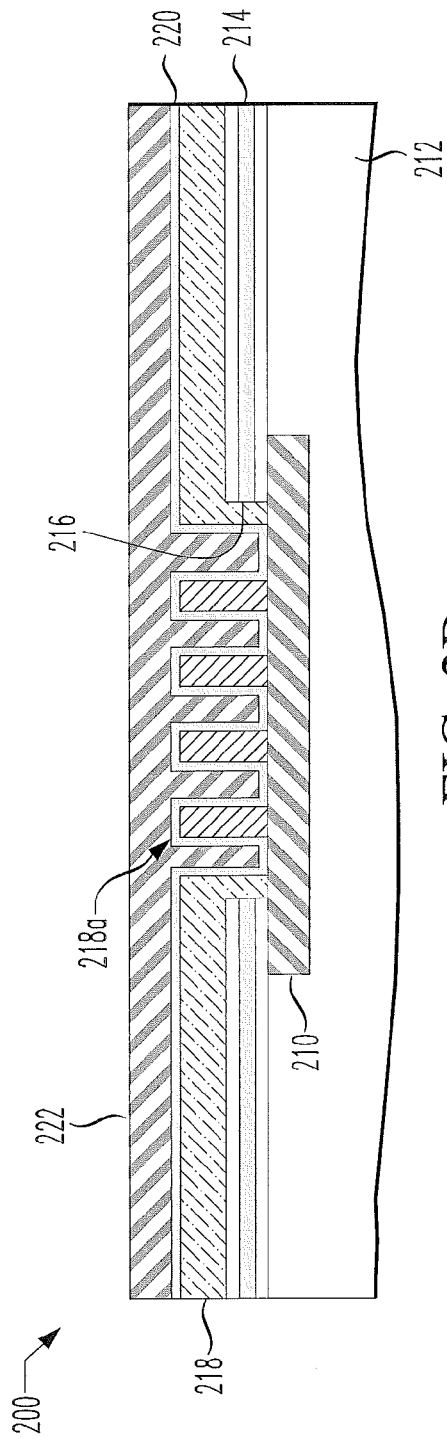
FIG. 2A
FIG. 2B

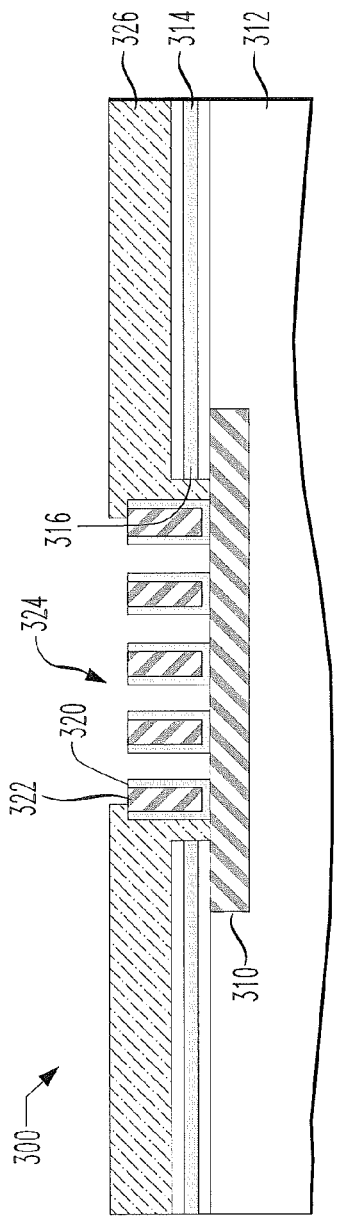
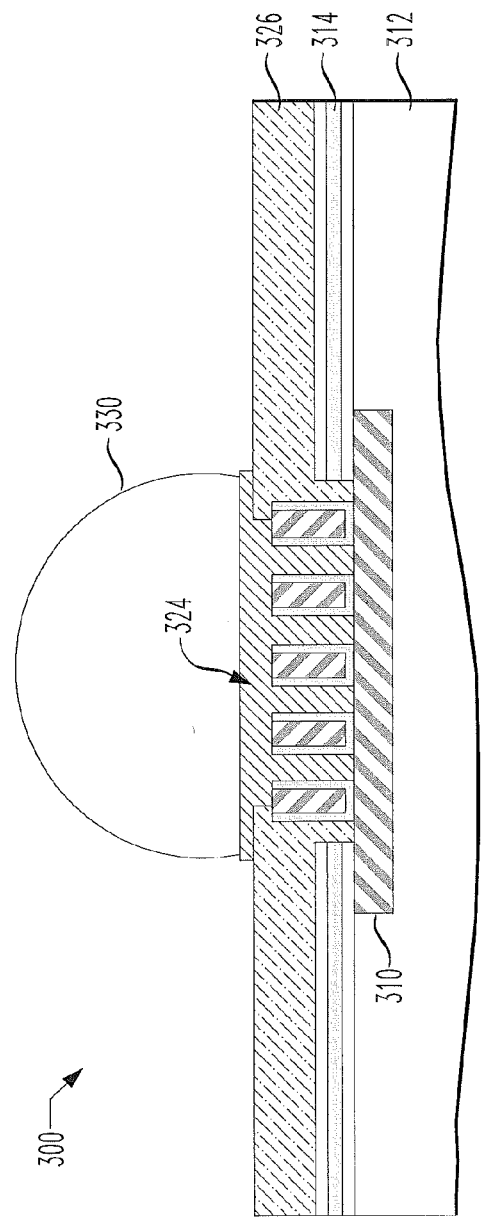
FIG. 3A
FIG. 3B

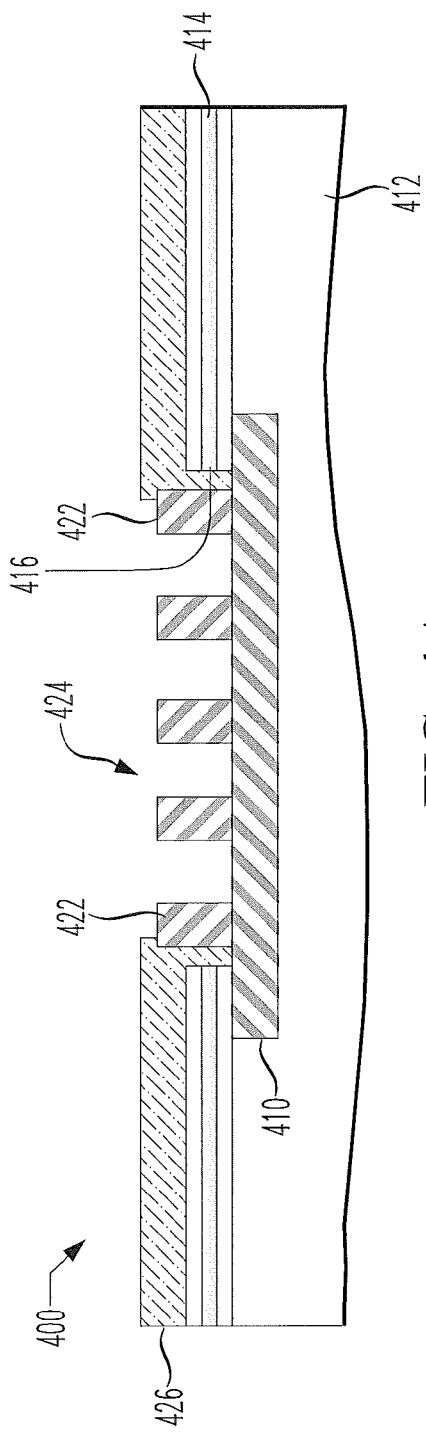
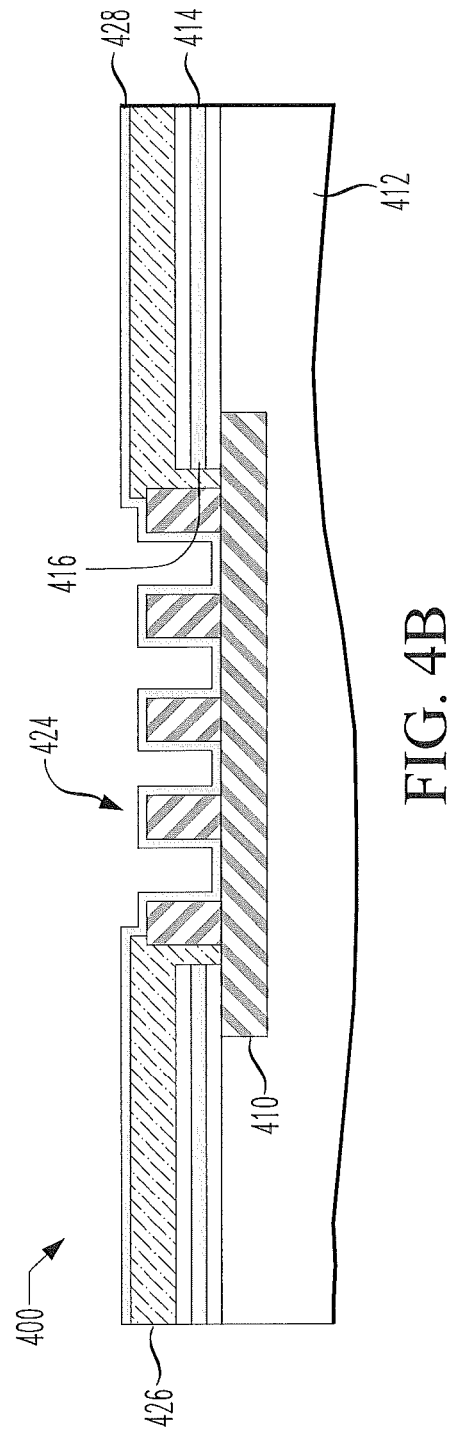
FIG. 4A
FIG. 4B

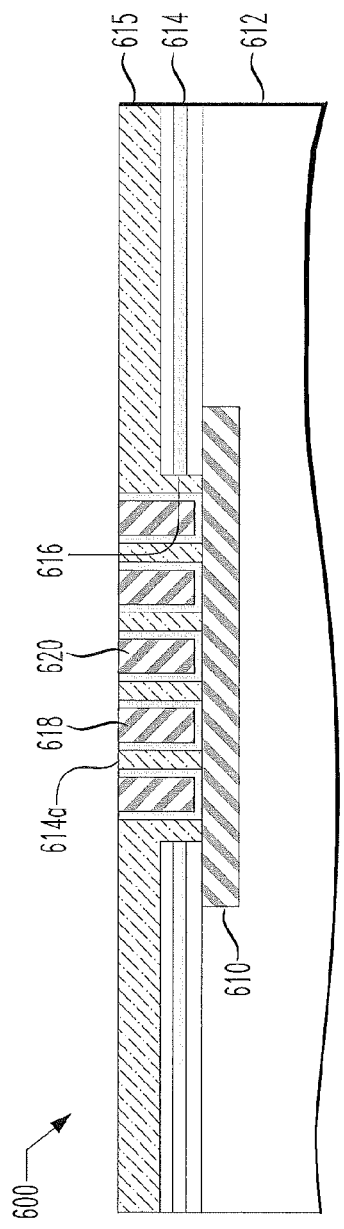
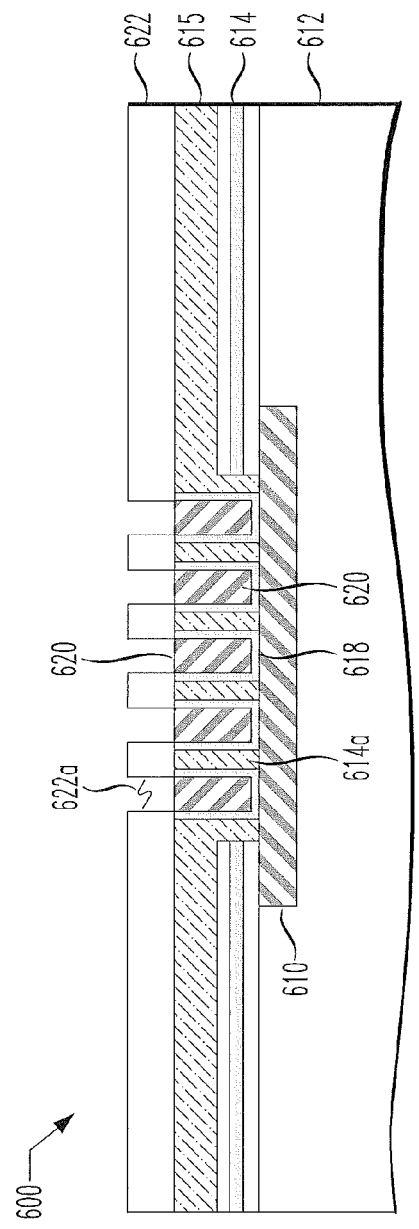

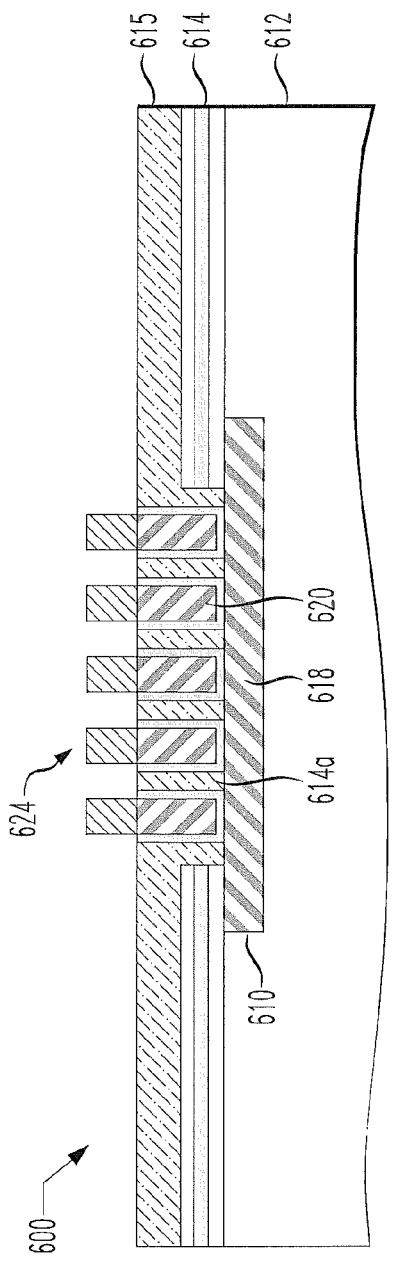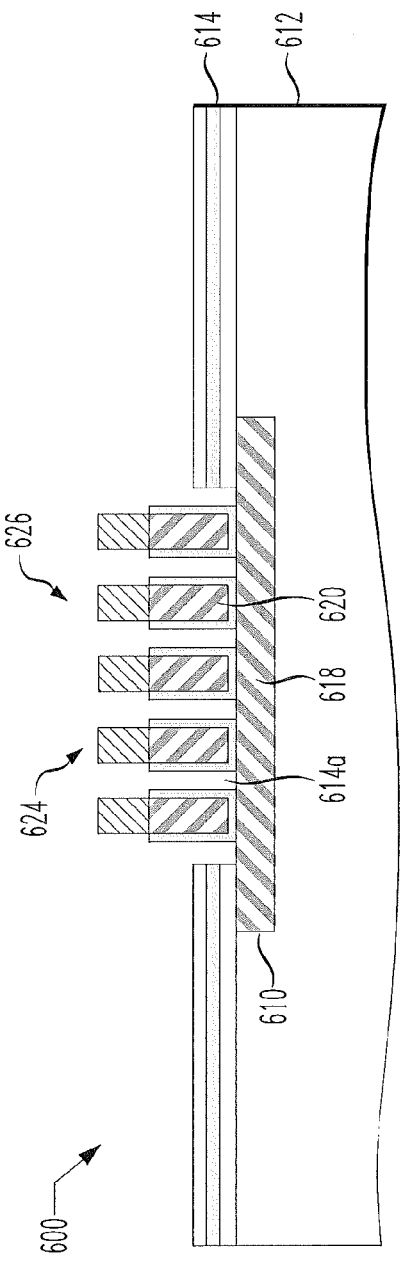
FIG. 6C
FIG. 6D

SOLDER BUMP STRUCTURE FOR FLIP CHIP SEMICONDUCTOR DEVICES AND METHOD OF MANUFACTURE THEREFORE

CROSS-REFERENCE TO RELATED APPLICATIONS

This application claims the benefit of U.S. Provisional Application No. 60/720,818 entitled "NOVEL STRUCTURES FOR FLIP CHIP TECHNOLOGY" to Mark A. Bachman, et al., filed on Sep. 27, 2005 which is commonly assigned with the present invention and incorporated herein by reference as if reproduced herein in its entirety.

TECHNICAL FIELD OF THE INVENTION

The invention is directed, in general, to a semiconductor device and, more specifically, to a semiconductor device having an improved solder bump structure for flip chip applications.

BACKGROUND OF THE INVENTION

Flip chip technology has been used for a number of years by the microelectronics industry to attach semiconductor devices to substrates. In this technology, the device is "bumped" with solder bumps that are reflowed to similar bumps on a substrate. The solder is allowed to melt on both the device and the substrate when the two are in contact with each other in a reflow oven.

While this method has worked very well for older technologies, the industry is reaching a point where conventional flip chip bump fabrication schemes are not suitable for today's devices. The reliability of the under-bump metallization (UBM) and the constituent film stack, typically consisting of tantalum nitride/nickel-vanadium/copper, is of issue and mechanical and electrical failures are most commonly found in this region. The UBM typically consists of 2 or 3 films with a total thickness of less than 1.5 to 2 microns, compared to the solder that is typically 50 to 100 microns thick. Unless the UBM/chip/substrate bond is mechanically and metallurgically sound, cracking and delamination can occur within the UBM, resulting in poor device reliability.

Moreover, there has been an emphasis in the microelectronics industry to eliminate lead-based solders from devices and the manufacturing process and begin using lead-free materials in forming the solder bumps that are used to electrically attach integrated circuits (IC) chips to an operative substrate.

To address this issue the industry as recently turned to a copper pillar technology. In such technologies, a passivation layer is deposited over the final or uppermost copper interconnect layer. An opening is formed in the passivation layer to expose the underlying interconnect layer and a barrier layer is deposited therein, followed by the deposition of a copper seed layer. Photoresist is then deposited and patterned and etched to form an opening in the photoresist to expose the underlying barrier layer located within the opening formed in the passivation layer. Copper is deposited into the opening to partially fill it. A lead-free solder from a group consisting of tin-based or silver-copper-tin based materials is deposited into the remainder of the opening. The photoresist is removed, which results in a single-pillar structure that is located within and fills the opening in the passivation layer.

While this device is acceptable for current technologies, there is a concern that this structure will not have sufficient mechanical stability as technologies continue to shrink. The reason for this concern is that in these structures, there is only a small area of solder that is available for connection. In view of this, the joint can fatigue whether lead or lead-free solder is used. Further, since the bond area is confined to only the top regions of the pillar, if a slight mis-registry occurs during the assembly process, it may create problems, such as an electrical open.

Accordingly, what is needed in the art is a solder bump structure that addresses both the metallurgical concerns and mechanical stability concerns associated with the above-discussed conventional structures.

SUMMARY OF THE INVENTION

To address the above-discussed deficiencies of the prior art, the invention, in one embodiment, provides a semiconductor device that comprises an interconnect layer located over a semiconductor substrate. A passivation layer is located over the interconnect layer and has a solder bump support opening formed therein. Support pillars that comprise a conductive material are located within the solder bump support opening.

The foregoing has outlined one embodiment of the invention so that those skilled in the art may better understand the detailed description of the invention that follows. Additional embodiments and features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which:

FIGS. 2A-2E illustrate partial views of one embodiment of a solder bump structure provide by the invention at various stages of manufacture.

FIGS. 3A-3B illustrate partial views of another embodiment of a solder bump structure provide by the invention at various stages of a different method of manufacture;

FIGS. 4A-4D illustrate partial views of another embodiment of a solder bump structure provide by the invention at various stages of a different method of manufacture;

FIGS. 6A-6E illustrate partial views of another embodiment of a solder bump structure provide by the invention at various stages of a different method of manufacture.

DETAILED DESCRIPTION

Figure 1A:
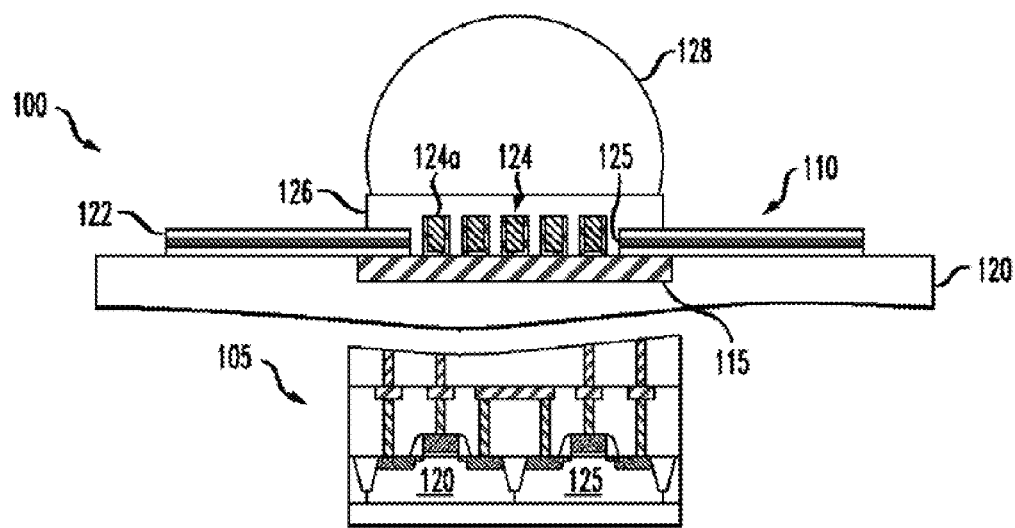
FIG. 1A illustrates a partial view of an IC that includes one embodiment of a solder bump structure provided by the invention.

Referring initially to FIG. 1A, there is illustrated a general view of one embodiment of a semiconductor device 100 as provided by the invention. The structures provided by the present invention are particularly useful in flip chip technologies to which the semiconductor manufacturing industry is rapidly turning. The flip chip technology provides greater ease in soldering chips to a substrate or to one another. Additionally, the flip chip technology is more cost effective. In the illustrated embodiment, the semiconductor device 100 may include an IC 105, a partial view of which is generally shown. Since, the IC 105 may be of conventional design a detailed discussion of its fabrication is not necessary. Further, the IC 105 is not limited to any particular type of device or design. For example, it may be an optoelectronics device or an electromechanical device.

A portion of the IC 105 is electrically connected to solder bump structure 110. Solder bump structure 110 is but one embodiment covered by the invention. Other non-limiting embodiments are discussed below. The electrical connections are not shown, but those who are skilled in the art would understand how the devices would be electrically connected. The solder bump structure 110 is located over an interconnect 115 that is formed in a dielectric layer 120. The interconnect 115 may be of conventional design, such as a damascene or dual damascene interconnect structure. While the interconnect structure 115 will typically be the final metallization level that is located on the uppermost level of the semiconductor device 100, it may be located below the final level.

A passivation layer 122 is located over the dielectric layer 120 and over a portion of the interconnect 115. As used herein, a layer may be a single layer or may comprise a stack of layers. The passivation layer 122 may be of conventional design in that it may consist of a stack of layers as shown. While the illustrated embodiment shows the passivation layer 122 located directly on the dielectric layer 120, in other embodiments, there may be intervening layers located between the two.

Figure 1B:
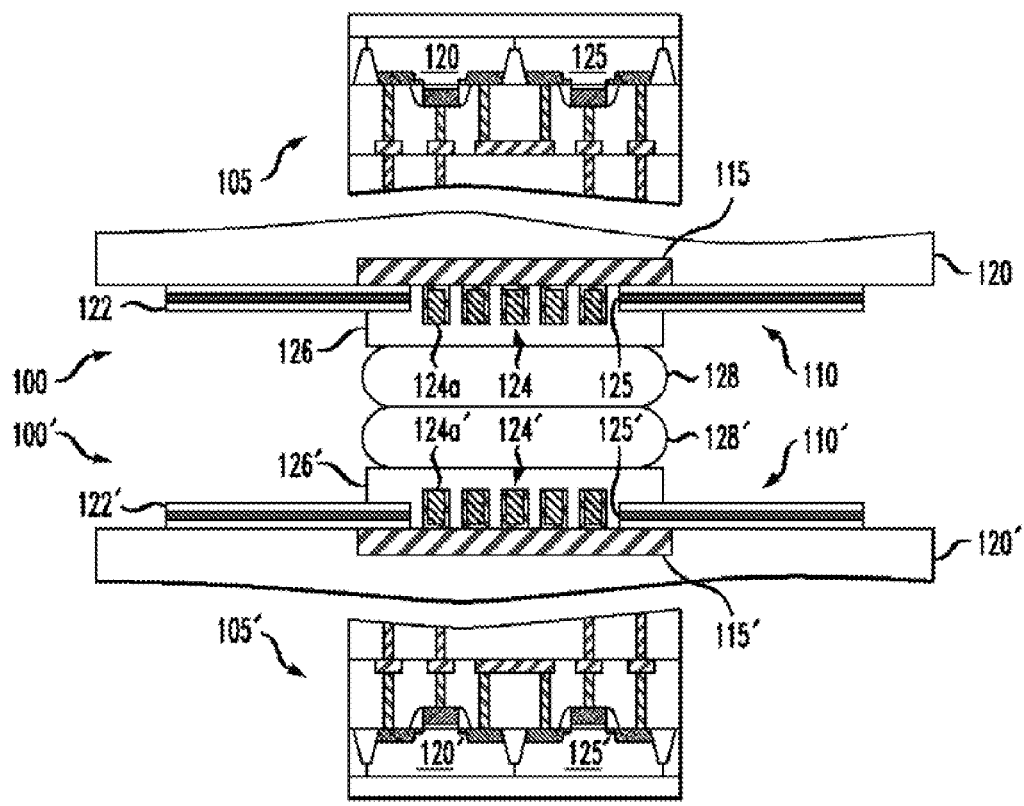
FIG. 1B illustrates a partial view of two IC as shown in FIG. 1A bond together in a flip chip configuration.

Support pillars 124 are located in an opening 125 located between two portions of the passivation layer 122. The opening 125 may be formed by removing a portion of the passivation layer 122, as explained below, or the opening 125 may be formed by forming two separate portions of the passivation layer 122. The support pillars 124 may include an optional barrier layer 124a, such as the embodiment shown in FIG. 1A, or the barrier layer 124a may be excluded. In the embodiment shown in FIG. 1A, the support pillars 124 provide structural support for a UBM 126, which in turn, provides support for a solder bump 128. The solder bump 128 may be lead-based or lead-free, such as those that comprise tin, copper or silver, or combinations thereof. In this embodiment, a portion of the UBM 126 is located between the support pillars 124 and fills the opening 125. The plurality of support pillars 124 that are located within the opening 125 can provide improved support over single pillar technologies as overall device sizes continue to shrink. Moreover, the materials that can be used address international industry concerns of moving to systems that are substantially lead-free, while providing the required degree of connectibility and structural support for the solder bump 128. Examples of other embodiments covered by the invention will now be set forth. FIG. 1B shows the semiconductor device 100 bonded to a semiconductor device 100' having components similarly designated in a flip chip configuration.

Figure 2C:
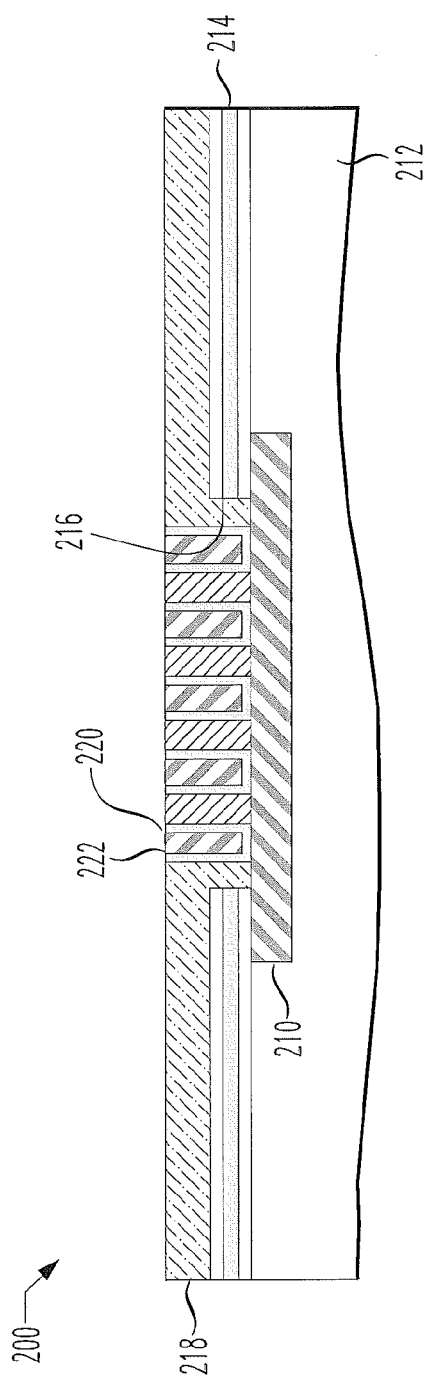

FIGS. 2A-2E show partial views of various stages of manufacture of one embodiment of a semiconductor device 200 as provided by the invention. These views are limited to the upper portion of the semiconductor device 200. In FIG. 2A, an interconnect 210 is formed in a dielectric layer 212. The interconnect 210 may be of conventional design and may comprise conventional materials, such as copper or aluminum. Further, the interconnect structure 210 may be a damascene or dual damascene structure. In the illustrated embodiment, the interconnect 210 may be the final metallization layer that is used to connect the semiconductor device 200 to other devices. The dielectric layer 212, which may also be comprised of conventional materials, is shown to be the final dielectric or uppermost layer of the semiconductor device 200. However, the interconnect structure 210 need not necessarily be formed in the final dielectric layer; in some embodiments, it may be located below the final dielectric layer.

A passivation layer 214 is located over the dielectric layer 212. Conventional processes and materials may be used to fabricate the passivation layer 214. For example, the passivation layer 214 may be comprised of stacked layers of silicon nitride/silicon dioxide/silicon nitride, or combinations thereof that are deposited using conventional processes. An opening 216 is formed in the passivation layer 214. In one embodiment, the passivation layer 214 is conventionally patterned to form the opening 216 therein. The opening 216 may be a single continuous opening as shown, or in other embodiments, it may be segmented as discussed below. In another embodiment, the passivation layer 214 is formed in such a way as to provide the opening 216, or space, between two opposing passivation layers 214 in which the support pillars 224 are located.

Following the formation of the opening 216 in the passivation layer 214, a sacrificial layer 218 is deposited over the passivation layer 214 and within the opening 216 as shown. The sacrificial layer 218 may be comprised of conventional materials, such as spin-on-glass, oxides, nitrides, silicon dioxide, or combinations thereof, that are deposited by conventional techniques, such as spin-on processes or chemical vapor deposition (CVD) processes.

In FIG. 2B, the sacrificial layer 218 is patterned to form segments 218a within the opening 216. Conventional processes, such as lithographic and subsequent etch processes, may be used to form the segments 218a. The patterning process exposes the underlying interconnect 210. Also, it should be noted that a portion of the sacrificial layer 218 remains on the sides of the opening 216 and serves as an offset for subsequently formed support pillars.

Following the appropriate clean steps, an optional barrier layer 220 is deposited over the sacrificial layer 218 and segments 218a and within the opening as illustrated. The barrier layer 220 may be comprised of conventional materials, such as tantalum/tantalum nitride (Ta/TaN), titanium/titanium nitride (Ti/TiN), or combinations thereof and may be deposited using conventional deposition processes, such as physical vapor deposition (PVD) or CVD processes. The barrier layer 220 promotes adhesion of subsequently deposited materials and also inhibits diffusion between differing materials.

A conductive material 222, such as aluminum, is deposited over the barrier layer 220, between the segments 218a, and within the opening 216. Conventional deposition processes may be used to achieve this step.

Figure 2D:
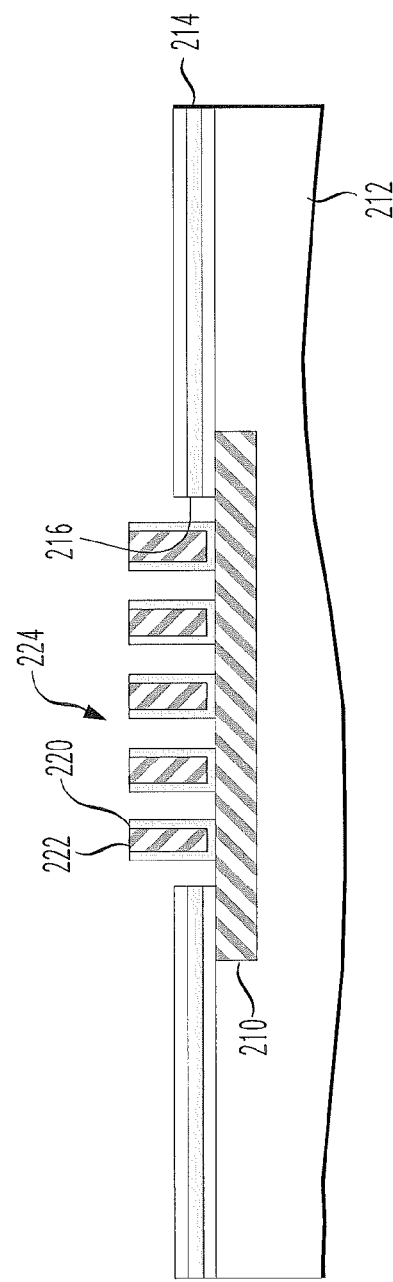

A conventional chemical/mechanical planarization (CMP) process may be used to remove the excess conductive material and the portion of the barrier layer 220 located on top of the segments 218a to arrive at the structure shown in FIG. 2C. Following the CMP process, a conventional etch may be conducted to remove the sacrificial layer 218 located over the passivation layer 214 and within the opening 216. This results in the formation of individual support pillars 224 within the opening 216, which are illustrated in FIG. 2D. As mentioned above, in those embodiments that include the barrier layer 220, the barrier layer 220 may be considered to form a portion of the support pillars 224. It should be noted that the support pillars 224 are not limited to any particular geometric formation or pattern. For example, the support pillars 224 may constitute trench configurations in a waffle-like pattern or other pattern, or they may be as represented in the illustrated embodiment. Due to the presence of the sacrificial layer located on the sides of the opening 216, the end support pillars 224 adjacent the sides of the opening 216 are off-set from the sides.

Figure 2E:
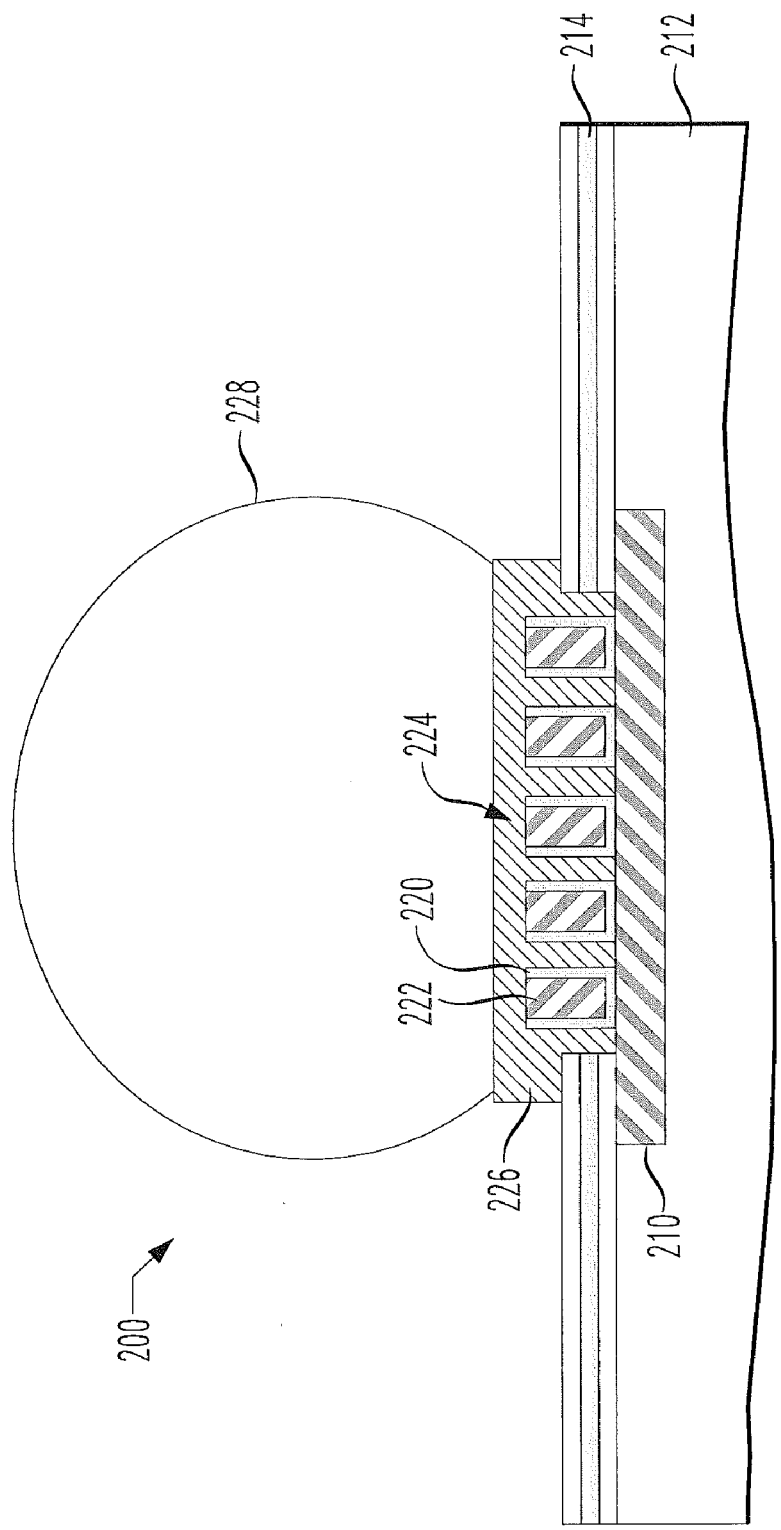

FIG. 2E shows the semiconductor device 200 of FIG. 2D following the deposition of a metal, such as titanium, nickel/vanadium-copper, or copper/chromium is blanket deposited over the passivation layer 214 and between the support pillars 224. The metal is then patterned, and in one embodiment a wet etch may be conducted to form a UBM structure 226. A solder bump 228, which may be comprised of a lead-free material, may then be deposited on the UBM structure 226, as shown. Conventional processes may also be used to achieve these steps.

During the etch of the metal that forms the UBM structure 226, the support pillars 224 are protected by the metal and are protected from being under cut by the wet etch because the support pillars 224 are protected by the barrier layer 220, which is not the case with prior art processes.

The support pillars 224 provide improved structural support over conventional solder bump structures. Furthermore, with the UBM structure 226 located between the support pillars 224, the combination of these two aspects provide for added structural support over that provided by prior art systems and provides a material system that can be used with lead-free solders. Moreover, this configuration increases surface area and provides for greater structural support and better mechanical anchoring of the solder bump 228.

Another benefit provided by this embodiment is that in those embodiments where the support pillars 224 comprise aluminum, the UBM structure 226 encapsulates the aluminum support pillars and prevents oxidation. Thus, the oxidation of the aluminum that occurs with prior art processes can be avoided or substantially reduced. The oxidation is undesirable because the oxide can weaken the metallurgical bonds between the materials and thereby weaken the mechanical stability. In addition, many prior art processes require two levels of passivation, one on top of the copper and one to protect the aluminum pad. With this embodiment, all that is needed is one wafer passivation because the UBM structure 226 is patterned, which results in cost savings, fewer processing steps, and therefore, improved yield.

FIG. 3A illustrates another embodiment of a semiconductor device 300 as provided by the invention. The structures may be the same as those previously described above with respect to the embodiments illustrated in FIGS. 2A-2F. As such, similar reference numbers are used to show corresponding structures. FIG. 3A illustrates the semiconductor device 300 shown at a point of manufacture where support pillars 324 have been fabricated in the same manner as described above in FIGS. 2A-2D. In this embodiment, however, the metal used to form the support pillars 324 is copper with the barrier layers 320 comprising Ta/TaN, Ti/TiN or combinations thereof. After deposition of the copper, CMP techniques known to those skilled in the art may be used to remove the excess copper and planarize it as described above with respect to other embodiments. The sacrificial layer is then removed.

A second passivation layer 326, which may also be a final passivation layer, is conventionally deposited over the passivation layer 314 and over and between the support pillars 324. Conventional processes may then be used to remove that portion of the second passivation layer 326 located over the support pillars 324. The exception here is that the second passivation layer 326 is patterned in such a way as to leave that portion that is located between the sides of the opening 316 and the sides of the end support pillars 324. This encapsulates the sides of the end support pillars and protects them from oxidation and subsequent etching processes.

Following the patterning of the second passivation layer 326, a metal layer is deposited and patterned to form a UBM 328, as illustrated in FIG. 3B. The same processes and materials used in previously discussed embodiments may be used here as well. The UBM 328 overlaps the second passivation layer 326 and is located between the support pillars 324. A solder bump 330 may then be deposited onto the UBM 328 as discussed regarding other embodiments.

Figure 3C:
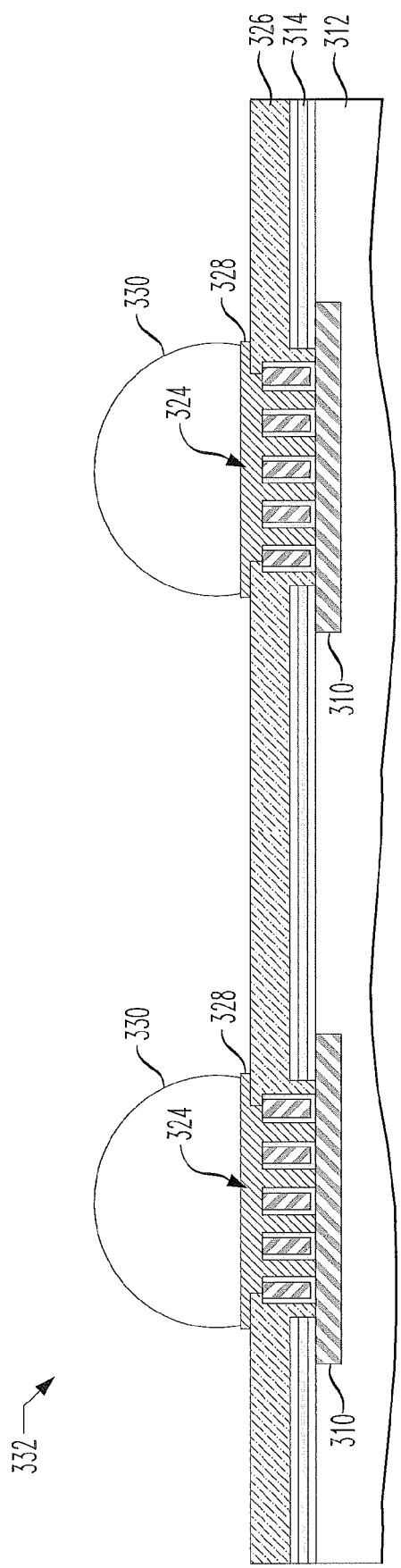
FIG. 3C shows a plurality of the device illustrated in FIG. 2E.

As with the previous embodiment, the support pillars 324 provide improved support over conventional structures. However, the structural advantage associated with the support pillar 324 is enhanced further when combined with UBM 328. Moreover, this configuration increases surface area and provides for greater structural support and better mechanical anchoring of the solder bump 330. FIG. 3C shows a plurality 332 of the device illustrated in FIG. 3B located on the substrate 312, the configuration of which is suitable for flip-chip applications.

Figure 4C:
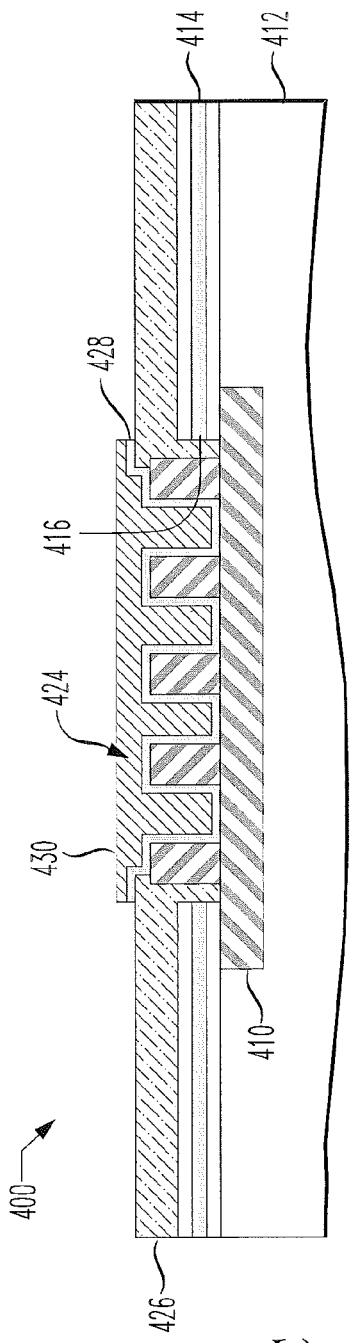
Figure 4D:
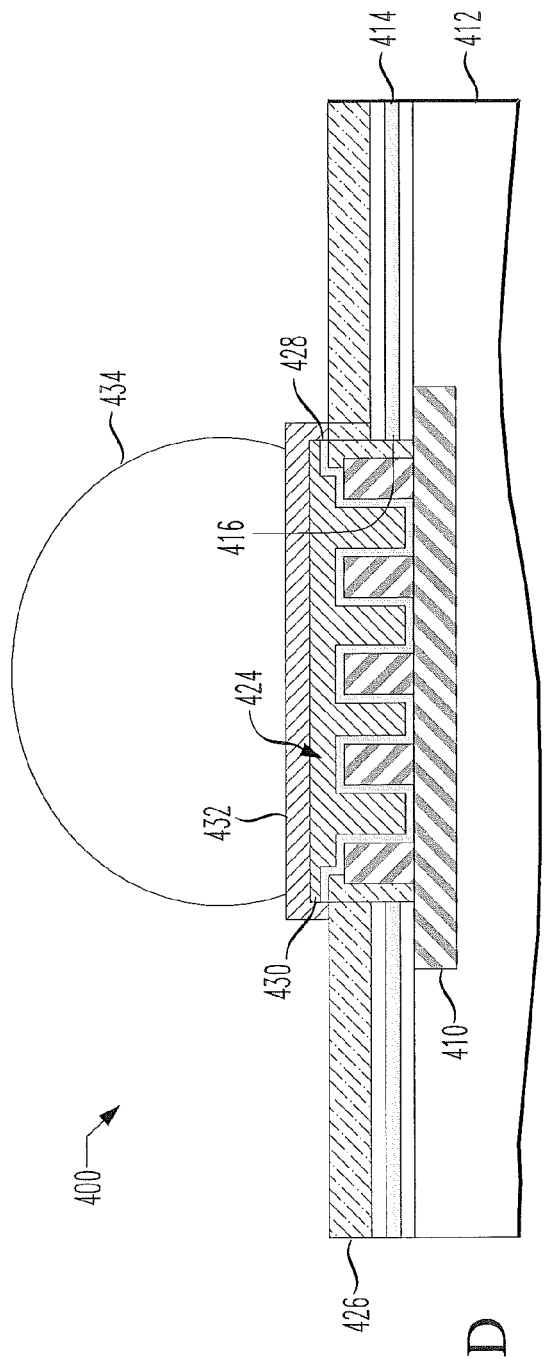

FIGS. 4A-4D illustrate another embodiment of a semiconductor device 400 provided by the present invention. The structures may be the same as those previously described above with respect to the embodiments illustrated in FIGS. 3A-3B, except that the barrier layer 320 is omitted. As such, similar reference numbers are used to show corresponding structures. FIG. 4A can be achieved by using the same processes that were used to arrive at the structure shown in FIG. 3A. That is, copper support pillars 424 are formed with the opening 416. A first sacrificial layer is deposited over the passivation layer 414 and patterned. A metal, such as copper, is then deposited within the pattern and the sacrificial layer is removed. The copper is deposited directly on the interconnect 410 without an intervening barrier layer. However, this embodiment does not preclude the use of a barrier layer. A second passivation layer 426, which may be a final passivation layer, is then deposited and patterned such that a portion of the second passivation layer 426 remains between the sides of the opening 416 and the end support pillars 422.

As seen in FIG. 4B, a barrier layer 428 is then deposited over the second passivation layer 426 and over and between the support pillars 424. The barrier layer 428 may be deposited using conventional deposition processes and may comprise materials, such as Ta/TaN, Ti/TiN, or combinations thereof.

In FIG. 4C, after the deposition of the barrier layer 428, a metal layer 430 that is different from that which comprises the support pillars 424 is blanket deposited over the semiconductor device 400 and patterned, as illustrated. In one embodiment, the metal comprises aluminum. The use of aluminum brings a degree of familiarity to the solder bump structure, and thus, may be more desirable to some manufacturers. However, the present invention is not limited to the use of aluminum. Other conductive metals, such as gold, silver, or copper may also be used. In those embodiments where aluminum is used, the barrier layer 428 prevents diffusion between the aluminum and copper. In other embodiments where the metal layer 430 may comprise copper or a metal that does not easily inter-diffuse with copper, the barrier layer 428 may be omitted.

The metal layer 430 is then etched. The metal layer 430 overlaps onto the second passivation layer 426 and fully encapsulates the support pillars 424. In an alternative embodiment, the metal layer 430 may be removed using a CMP process. In such embodiments, the metal layer 430 would be substantially flush with the second passivation layer 426 as opposed to being raised as shown in FIG. 4C Referring now to FIG. 4D, after the etch of the metal layer 430 is completed, the appropriate clean steps are conducted and a UBM 432 is formed over the metal layer 430. The UBM 432 may be fabricated as described above. The UBM 432 encapsulates the metal layer 430, thereby protecting it from being undercut during the formation of the UBM 432 and protecting it from oxidation. After the completion of the UBM 432, a solder bump 434 may be deposited onto the UBM 432. Conventional processes may be used and the solder may be a lead-free solder. The resulting structure shown in FIG. 4E provides the same structural and material advantages as with other above-discussed embodiments.

Figure 5A:
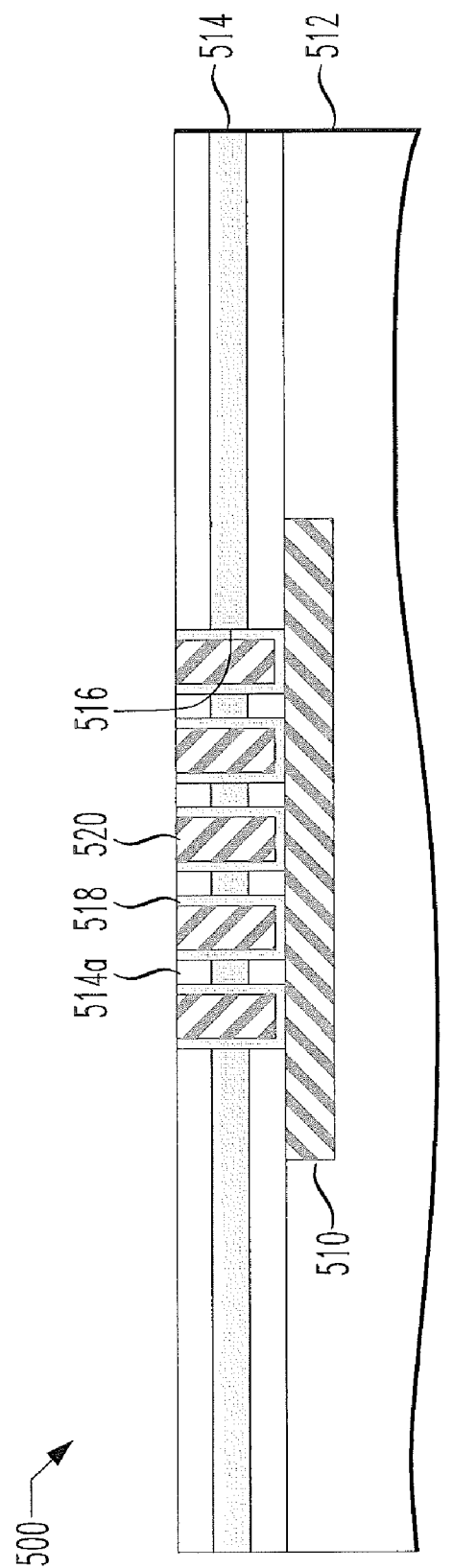
FIGS. 5A-5C illustrate partial views of another embodiment of a solder bump structure provide by the invention at various stages of a different method of manufacture.
Figure 5B:
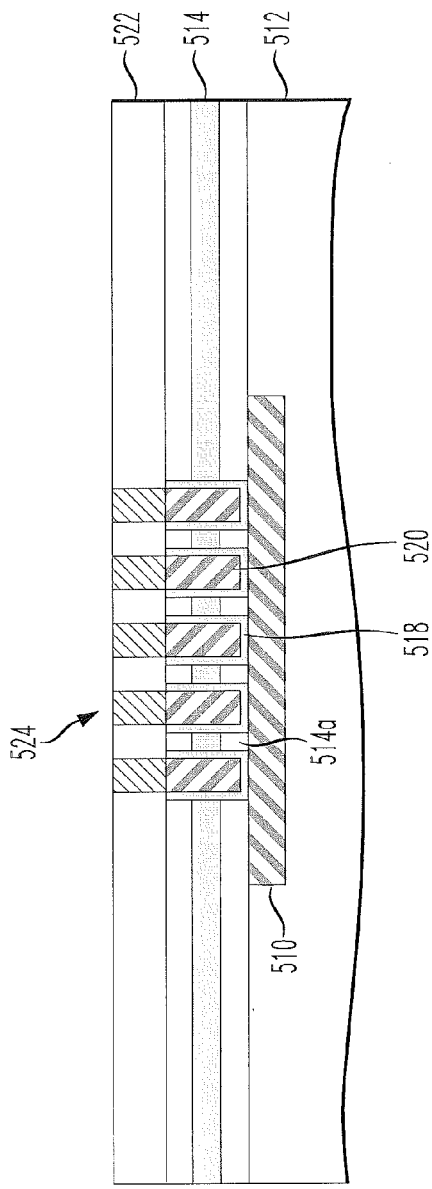
Figure 5C:
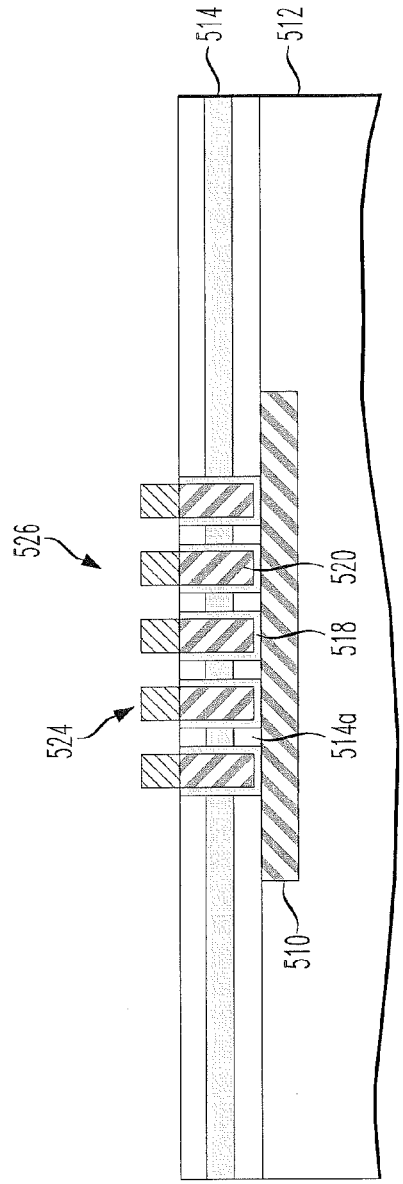

FIGS. 5A-5C illustrate another embodiment of a semiconductor device 500 provided by the invention. Unless otherwise noted, it should be understood that the processes and materials used to make the components that are similar to those in previous embodiments may be similar or the same. This embodiment is directed to forming a structurally sound solder structure that does not include a UBM as with previous embodiments. Nonetheless, this particular embodiment provides the same structural and material advantage associated with the other embodiments that are discussed above. Additionally, this embodiment is also very useful in flip chip applications, including stacking of chips.

In FIG. 5A, an interconnect 510 is located in a dielectric layer 512, and a passivation layer 514 is located over the dielectric layer 512. In this embodiment, the passivation layer 514 is patterned with a photoresist and etched to form segments 514a within an opening 516, which exposes the underlying interconnect 510. Conventional lithographic processes may be used to pattern the passivation layer 514. An optional barrier layer 518 may be deposited over the passivation layer 514. The barrier layer 518 may be comprised of Ti, TiN, Ta, Ta/N, Ni, Cr, etc. Conventional processes, such as PVD or CVD may be used to deposit the barrier layer 518. The deposition of the barrier layer 518 is followed by the deposition metal layer 520.

In one advantageous embodiment, the metal layer 520 is gold, however, other noble metals, such as silver and platinum may also be used. When gold is selected as the metal, a gold seed layer may first be deposited over the barrier layer 518, followed by electroplating gold to fill the openings located between the segments 514a to arrive at the structure shown in FIG. 5A. After the formation of the metal layer 520, the semiconductor device 500 of FIG. 5A is subjected to a CMP process to remove the excess portions of the metal layer 520 and the barrier layer 518 to arrive at the structure shown in FIG. 5A.

A photoresist layer 522 is deposited over the metal layer 520 and patterned to arrive at the structure shown in FIG. 5B. Both the processes and materials used to form the photoresist layer 522 may be conventional. The photoresist layer 522 is patterned in a way such that openings 522a in the photoresist substantially correspond to or substantially align with the sectioned metal layer 520. Given variations in photolithographic processes, it should be understood that the alignment of the openings 522a with respect to its underlying and corresponding sectioned metal layer 520 may be offset by an acceptable amount.

An alloy of the metal layer 520 has been conventionally blanket deposited, for example, by electroplating, and planarized to form extensions 524. In one embodiment, where the metal layer 520 is gold, the alloy may comprise, for example, gold/tin (Au/Sn), gold/germanium (Au/Ge), or gold/silicon (Au/Si). In such embodiments, the Au/Sn may have a composition wherein Sn comprises about 28 wt. % of the alloy and have a melting point of about 280° C., and the Au/Ge may have a composition wherein Ge comprises about 12 wt. % of the alloy and have a melting point of about 356° C. In the embodiment where the alloy is Au/Si, the Si may comprise about 6 wt. % of the alloy and have a melting point of about 370° C. Following the planarization of the alloy used to form the extensions 524, the photoresist layer 522 is removed to arrive at the structure shown in FIG. 5C, which includes support pillars 526 that have an extensions 524 located thereon.

The extensions 524 provide features that are available for bonding to a substrate. The embodiment shown in FIG. 5C is useful for devices having very small form factors, such as those used in hand held devices or mobile devices where surface area is very limited. Moreover, the gold alloy melts at low temperatures and easily mates onto a substrate and is a very, good conductor both thermally and electrically. Gold is also very useful in devices where good electrical and thermal conductivity is required, for example, in high voltage devices where large currents are required to go through the support pillars 526. The passivation layer 514 serves as the dielectric through which current may not pass. In this embodiment, no extra steps are required for additional passivation. In addition, because gold is being plated onto gold, no UBM is necessary.

Figure 6E:
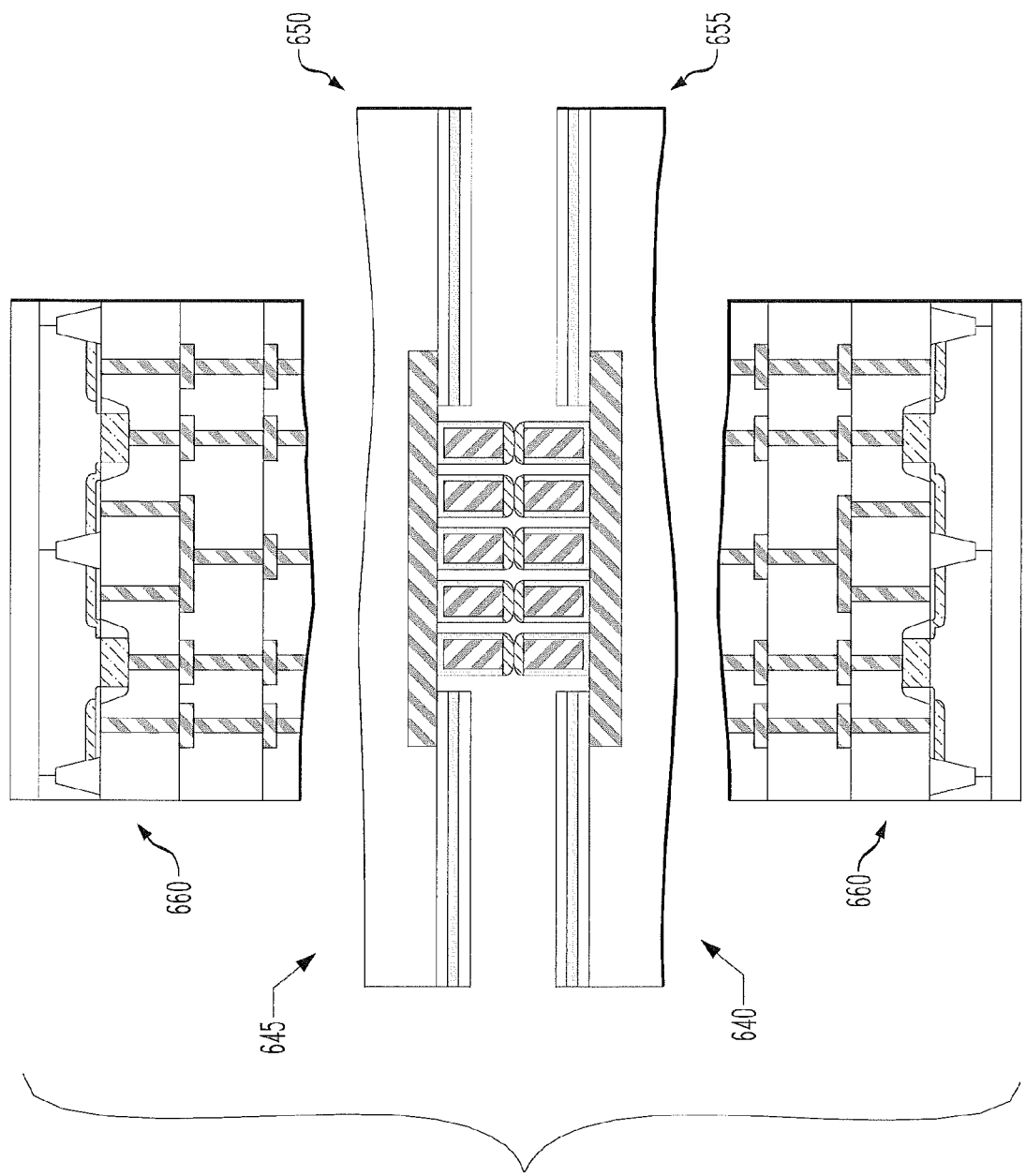

Another embodiment that is similar in some respects to the embodiment shown in FIGS. 5A-5C is illustrated in FIGS. 6A-6E. In FIG. 6A, an interconnect 610 is located in a dielectric layer 612, and a passivation layer 614 is located over the dielectric layer 612. A sacrificial layer 615 is patterned with a photoresist and etched to form segments 614a within an opening 616, which exposes the underlying interconnect 610. Conventional lithographic processes may be used to pattern the sacrificial layer 615. Then, an optional barrier layer 618 may be deposited over the sacrificial layer 615. The barrier layer 618 may be of the same type employed in the embodiments discussed with respect to FIGS. 5A-C. The deposition of the barrier layer 618 is followed by the deposition of a metal layer 620.

In one advantageous embodiment, the metal layer 520 is gold, however, other noble metals, such as silver and platinum may also be used. When gold is selected as the metal, a gold seed layer may first be deposited over the barrier layer 618, followed by electroplating gold to fill the openings located between the segments 614a. After the formation of the metal layer 620, the semiconductor device 600 is subjected to a CMP process to remove the excess portions of the metal layer 620 and the barrier layer 618 to arrive at the structure shown in FIG. 6A.

A photoresist layer 622 is deposited over the metal layer 620 and patterned to arrive at the structure shown in FIG. 6B. Both the processes and materials used to form the photoresist layer 622 may be conventional. The photoresist layer 622 is patterned in a way such that openings 622a in the photoresist substantially correspond to or substantially align with the sectioned metal layer 620. Given variations in photolithographic processes, it should be understood that the alignment of the openings 622a with respect to its underlying and corresponding sectioned metal layer 620 may be offset by an acceptable amount.

In FIG. 6C an alloy of the metal layer 620 has been conventionally blanket deposited, for example, by electroplating, and planarized to form extensions 624 within the photoresist 622. In one embodiment, where the metal layer 620 is gold, the alloy may comprise the same type of materials discussed above with respect to FIGS. 5A-5C. Following the planarization of the alloy used to form the extensions 624, the photoresist layer 622 is removed to arrive at the structure shown in FIG. 6C.

The sacrificial layer 615 is also removed which forms support pillars 626 having the extensions 624 located thereon as shown in FIG. 6D. As seen in FIG. 6D, the support pillars 626 with the extensions 624 extend well above the passivation layer 614. This configuration is particularly advantageous if more mechanical stability is required or more distance between coupled devices is required. Thus, the semiconductor device shown in FIG. 6D is particularly useful when it is desired to bond two flip-chips 630 and 635 (each having the same type of structure as illustrated in FIG. 6D) together as shown in FIG. 6E. The devices are re-flowed and the extensions 624 on each respective chip melt and bond with each other to provide electrical connection between the two devices.

With continued reference to FIG. 6E, there is illustrated a partial view of IC flip chips 640 and 645 that comprises the solder bump structures 650 and 655 that are electrically connected to underlying transistor structures 660 and 665. It should be understood, of course that the solder bump structures 650 and 655 could be formed on both sides to the flip chips to allow for the devices to be stacked. It should also be understood that any of the previously-described embodiments of the solder bump structure may be used in place of the embodiment that is illustrated. The assembly of the resultant structure is then completed using "under fill" or similar compounds to fill the gaps between the devices 640 and 645. Those skilled in the art may also recognize that the IC flip-chip 640 may be attached to a flexible or another substrate containing similar mating features.

Although the present invention has been described in detail, those skilled in the art should understand that they can make various changes, substitutions and alterations herein without departing from the spirit and scope of the invention in its broadest form.

What is claimed is:

1. A semiconductor device, comprising:
   an interconnect layer located over a semiconductor substrate;
   a first passivation layer located over the interconnect layer and having a solder bump support opening formed therein;
   a second passivation layer located over the first passivation layer and extending along the sidewall of the first passivation layer within the opening;
   support pillars located within the solder bump support opening and on the interconnect layer, the support pillars comprising a conductive material, wherein the second passivation layer is located between the sidewall of the first passivation layer and at least one of the support pillars; and
   an under bump metallization (UBM) layer located over and between the support pillars, and wherein the UBM layer extends over and contacts the second passivation layer.

2. The semiconductor device recited in claim 1, wherein the support pillars include a barrier layer that is located on the interconnect layer and on the support pillars.

3. The semiconductor device recited in claim 1, wherein the support pillars form a first group of support pillars and further including a second group of support pillars located within the solder bump support opening and between ones of the first group of support pillars and comprising a different conductive material from the first group.

4. The semiconductor device recited in claim 3, wherein the conductive material comprises copper and the different conductive material comprises aluminum.

5. The semiconductor device recited in claim 4, wherein the UBM layer is located on the aluminum.

6. The semiconductor device recited in claim 1, further comprising:
   a plurality of groups of the support pillars with each group having a UBM layer located thereover; and
   a solder bump located on each of the UBM layers and wherein the semiconductor device comprises an integrated circuit (IC) flip chip.

7. The semiconductor device recited in claim 6, wherein the solder bump is comprised of a lead solder or a lead-free solder.

8. A semiconductor device, comprising:
   an interconnect layer located over a semiconductor substrate;
   a passivation layer located over the interconnect layer and having a solder bump support opening formed therein;
   support pillars located within the solder bump support opening, the support pillars comprising a conductive material; and
   an under bump metallization (UBM) layer located over the support pillars, wherein the UBM layer is located between at least one of the support pillars and a sidewall of the opening formed in the passivation layer and contacts the sidewall of the opening.

9. The semiconductor device recited in claim 8 wherein a portion of the UBM layer is located within the opening and between sidewalls of the passivation layer that define the opening and at least one of the support.

10. The semiconductor device recited in claim 8, wherein the support pillars include a barrier layer that is located on the interconnect layer and on the support pillars.

* * * * *

UNITED STATES PATENT AND TRADEMARK OFFICE
CERTIFICATE OF CORRECTION

PATENT NO. : 7,952,206 B2  
APPLICATION NO. : 11/459249  
DATED : May 31, 2011  
INVENTOR(S) : Mark A. Bachman et al.

It is certified that error appears in the above-identified patent and that said Letters Patent is hereby corrected as shown below:

In Column 1, line 50, the word "as" should be -- has --.

In Column 2, lines 41-43, delete and replace as follows:

FIGs. 1A and 1B illustrate partial views of an IC that includes one embodiment of solder bump structure provided by the invention;

In Column 2, line 66, delete "FIG. 1" and replace with -- FIGs. 1A and 1B --.

In Column 3, lines 2-3, after the word "technologies", insert -- , a configuration of which is shown in FIG. 1B, --.

In Column 3, line 42, delete "FIG. 1A" and replace with -- FIGs. 1A and 1B --.

In Column 3, line 44, delete "FIG. 1A" and replace with -- FIGs. 1A and 1B --.

In Column 6, line 10, change "3B" to -- 3C --.

In Column 6, lines 26-44, delete and replace as follows:

FIGS. 4A-4D illustrate another embodiment of a semiconductor device 400 provided by the present invention. Some of the structures may be the same as those previously described above with respect to the embodiments illustrated in FIGS. 3A-3B, except that in the embodiment of FIGs. 4A-4D, the barrier layer 320 of FIG. 3A is omitted. As such, similar reference numbers are used to show corresponding structures. In this process, a first passivation layer 414 is deposited over a dielectric layer 412. An opening 416 is formed in the first passivation layer 414. A second passivation layer 426 is deposited over the first passivation layer 414 and within the opening 416 and patterned. Copper support pillars 422 are formed by depositing copper within the pattern of the second passivation layer 426, after which the second passivation layer 426 is removed. such that a portion of Signed and Sealed this  
Fifth Day of March, 2013

Teresa Stanek Rea  
*Acting Director of the United States Patent and Trademark Office*

CERTIFICATE OF CORRECTION (continued)
U.S. Pat. No. 7,952,206 B2 the second passivation layer 426 remains between the sides of the opening 416 and the end support pillars 422.

In Column 7, line 44, delete "gold, however," and replace it with -- gold. However, --.

In Column 8, line 44, delete "gold, however," and replace it with -- gold. However, --.

In Column 9, line 14, delete "630 and 635" and replace it with -- 640 and 645 --.

In Column 9, line 23, delete the word "underlying".

In Column 9, line 23, delete "and 665" before the period at the end of the respective sentence.

In Column 9, line 31, delete "devices" and replace it with -- IC flip chips --.